(12) United States Patent
Sterregaard et al.

(10) Patent No.: US 10,521,518 B2
(45) Date of Patent: Dec. 31, 2019

(54) EMULATING POWER SYSTEM OPERATIONS

(71) Applicant: DEIF A/S, Skive (DK)

(72) Inventors: Claes Høll Sterregaard, Skive (DK); Mogens Feldthaus Fyhn, Struer (DK)

(73) Assignee: Deif A/S, Skive (DK)

( * ) Notice: Subject to any disclaimer, the term of this patent is extended or adjusted under 35 U.S.C. 154(b) by 825 days.

(21) Appl. No.: 13/705,607

(22) Filed: Dec. 5, 2012

(65) Prior Publication Data
US 2014/0156250 A1    Jun. 5, 2014

(51) Int. Cl.
*G06F 17/50*    (2006.01)

(52) U.S. Cl.
CPC .................. *G06F 17/5009* (2013.01)

(58) Field of Classification Search
None
See application file for complete search history.

(56) References Cited

U.S. PATENT DOCUMENTS

| | | |
|---|---|---|
| 4,359,984 A | 11/1982 | Nakao |
| 4,445,180 A | 4/1984 | Davis et al. |
| 5,783,932 A | 7/1998 | Namba et al. |
| 5,886,895 A | 3/1999 | Kita et al. |
| 6,625,520 B1 | 9/2003 | Chen |
| 6,868,368 B1 | 3/2005 | Lang |
| 6,983,640 B1 | 1/2006 | Staphanos et al. |
| 7,058,552 B2 | 6/2006 | Stothert et al. |
| 7,356,383 B2 | 4/2008 | Pechtl et al. |
| 7,426,450 B2 | 9/2008 | Arnold et al. |
| 7,599,750 B2 | 10/2009 | Piche |
| 8,098,054 B2 | 1/2012 | Verschuur |

(Continued)

FOREIGN PATENT DOCUMENTS

| | | |
|---|---|---|
| EP | 1013498 | 6/2000 |
| JP | 2570558 B2 | 6/1994 |

(Continued)

OTHER PUBLICATIONS

Lukas, Michael D., Kwang Y. Lee, and Hossein Ghezel-Ayagh. "Modeling and cycling control of carbonate fuel cell power plants." Control Engineering Practice 10.2 (2002): 197-206.*

(Continued)

*Primary Examiner* — Bijan Mapar
(74) *Attorney, Agent, or Firm* — Nixon Peabody LLP

(57) ABSTRACT

Systems and methods of emulating power system operations. The Emulation system may include a software model of an engine driven electrical power generator, Emulation code to enable various testing of one or more power system components, and using real-world values, where applicable, to enhance the Emulation and test operation of the power system. An example method may include receiving a desired operating configuration of a proposed power system. The method may also include simulating operating data of at least one component of the power system. The method may also include emulating operations of the proposed power system using at least some actual operating data and the simulated operating data. The method may also include outputting emulated operational data for the proposed power system into an actual control and monitoring system to emulate operations of the proposed power system.

9 Claims, 8 Drawing Sheets

(56) References Cited

U.S. PATENT DOCUMENTS

| | | | |
|---|---|---|---|
| 8,139,108 | B2 | 3/2012 | Stratton |
| 8,267,064 | B2 | 9/2012 | Martin |
| 8,792,217 | B2 | 7/2014 | Shah |
| 2002/0116925 | A1 | 8/2002 | Hampson et al. |
| 2003/0196633 | A1 | 10/2003 | Gottemoller et al. |
| 2004/0102872 | A1 | 5/2004 | Schick |
| 2004/0140674 | A1 | 7/2004 | Nguyen |
| 2005/0283346 | A1 | 12/2005 | Elkins |
| 2007/0010988 | A1 | 1/2007 | Nakamura |
| 2008/0077368 | A1* | 3/2008 | Nasle .............. G05B 17/02 703/4 |
| 2008/0188955 | A1 | 8/2008 | Dittes |
| 2009/0276103 | A1 | 11/2009 | Iwamoto |
| 2010/0185336 | A1* | 7/2010 | Rovnyak ............ H02J 3/38 700/287 |
| 2010/0300405 | A1 | 12/2010 | Uhrich |
| 2011/0276194 | A1 | 11/2011 | Emalfarb |
| 2012/0022713 | A1* | 1/2012 | Deaver, Sr. ........ G05B 17/02 700/298 |
| 2012/0063039 | A1* | 3/2012 | Shah ............... H02H 7/261 361/20 |
| 2012/0292904 | A1 | 11/2012 | Tarnowski |

FOREIGN PATENT DOCUMENTS

| | | |
|---|---|---|
| WO | 1995/016296 A1 | 6/1995 |
| WO | WO2012/135258 | 10/2012 |

OTHER PUBLICATIONS

Torres, M., and L. A. C. Lopes. "Frequency control improvement in an autonomous power system: An application of virtual synchronous machines." Power Electronics and ECCE Asia (ICPE & ECCE), 2011 IEEE 8th International Conference on. IEEE, 2011. (Year: 2011).*

P.Y. Lim et al., "Modelling and Simulation of Photovoltaic-Variable Speed Diesel Generator Hybrid . . . ", IJES vol. 2 No. 1 2012 (Feb. 2012), pp. 5-14 www.ijesci.org., © World Academic Publishing.

Gene Abruzere, Simulation Evolves in Power Plants, Control Engineering, Apr. 2009, pp. 1-4.

Lokendra Bam et al., "Review: Power System Analysis Software Tools", pp. 1-6, ©2005 IEEE.

Jean Bélanger et al., "Real-Time Digital Simulation and Control Laboratory for Distributed Power Electronic Generation and Distribution", pp. 1-15, Huntsville Simulation Conference 2005.

Professor Alain Bouscayrol, Tutorial, "Hardware-In-The-Loop (HIL) Simulation in the framework of MEGEVH, French network on HEVs", pp. 1-3, EVS-24, May 13, 2009.

Randy Burch, Monitoring and Optimizing PID Loop Performance, pp. 1-12, Copyright 2004 by ISA. Presented at Houston ISA Expo 2004 http:/www.isa.org.

Juan A. Carrasco et al., "Analysis of the use of industrial control systems in simulators: State of the art and basic guidelines", ISA Transactions®, vol. 45, No. 2, Apr. 2006, pp. 295-312.

Brian Davison, "Development of a wind turbine emulator control system", MSc Energy and Environmental Engineering (2011), pp. 1-129.

ETAP Transient Stability Validation Cases and Comparison Results, pp. 1-8, Copyright © 2005 Operation Technology, Inc.

ETAP 7.0 New Features Reference Manual, pp. 1-32, www.etap.com, © 2009 (See p. 31).

Power System Modeling & Simulation | GGDFSUEZ—Eurostag, pp. 1-4, http://www.eurostag.be/en/publications/power-system-modeling-and-simulation/publication, Apr. 22, 2015.

S. Jaganathan et al., "Synchronous Generator Modelling and Analysis for a Microgrid in Autonomous and Grid Connected Mode", pp. 3-7, Int'l Journal of Computer Applications, Jan. 2011.

Klimis Ch. Karasavvas, "Modular simulation of a hybrid power system with diesel, photovoltaic inverter and wind turbine generation", Journal of Engineering Science and Technology Review 1 (2008) 38-40.

N.J. Kelly et al., "Developing and testing a generic micro-combined heat and power model for simulations of dwellings and highly distributed power systems", JPE532 © IMechE 2008.

Ian McGregor, "The Relationship Between Simulation and Emulation", Proceedings of the 2002 Winter Simulation Conference, pp. 1683-1688.

J.M. Prousalidis, "Reactive power sharing in ship energy systems with shaft generators", No. A13 2009 Journal of Marine Engineering and Technology, pp. 21-38.

Quanta Technology, "Real-Time Simulation & Testing Laboratory Utilizing Real-Time Digital Simulation (RTDS®) Technology", Copyright © 2012 (See p. 2), www.Quanta-Technology.com.

RTDS News May 2002, "Real time digital simulation for the power industry", RTDS Technologies.

Shervin Shokooh, et al., "What you Always Wanted from a Power Management System", pp. 1-5, Fall 2001.

Øyvind Smogeli, "Experiences from five years of DP software testing", MTS DP Conference, Houston, Oct. 2010, pp. 1-20, www.marinecybernetics.com.

Michael "Mischa" Steurer, "Power System Driven Hardware in the Loop Simulations at Florida State University's Center for Advanced Power System", TCIPG Seminar, Dec. 2, 2011, pp. 1-36.

P. Y. Lim et al., "Modelling and Simulation of Photovoltaic-Variable Speed Diesel Generator Hybrid Power System for Off-Grid Rural Electrification," International Journal of Energy Science (IJES), vol. 2 No. 1, 2012, pp. 5-14.

PCT International Search Report (ISR) for related filing PCT/DK2013/050415, dated 2014.

PCT International Search Report (ISR) for related filing PCT/DK2013/050413, dated 2014.

PCT International Search Report (ISR) for related filing PCT/DK2013/050414, dated 2014.

* cited by examiner

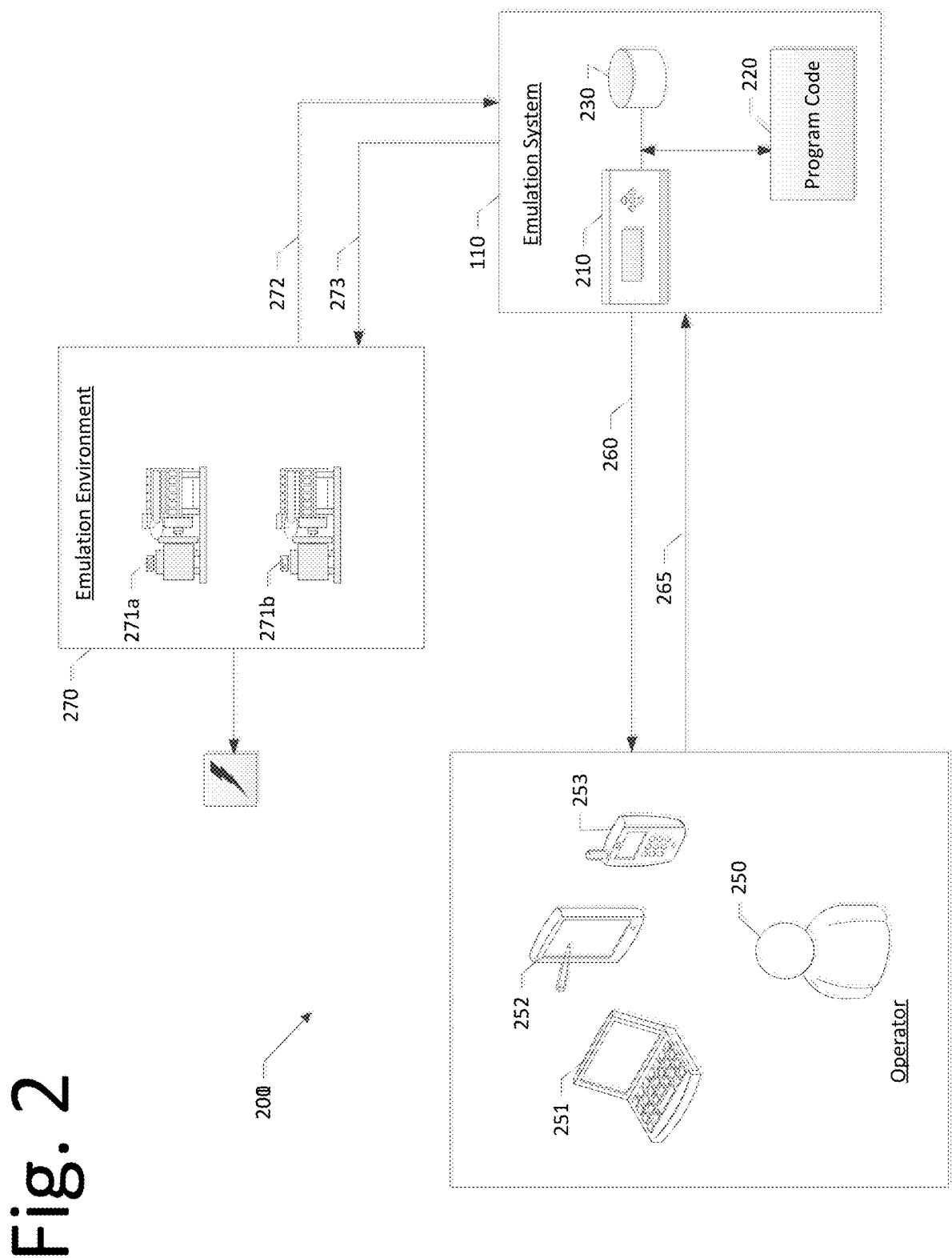

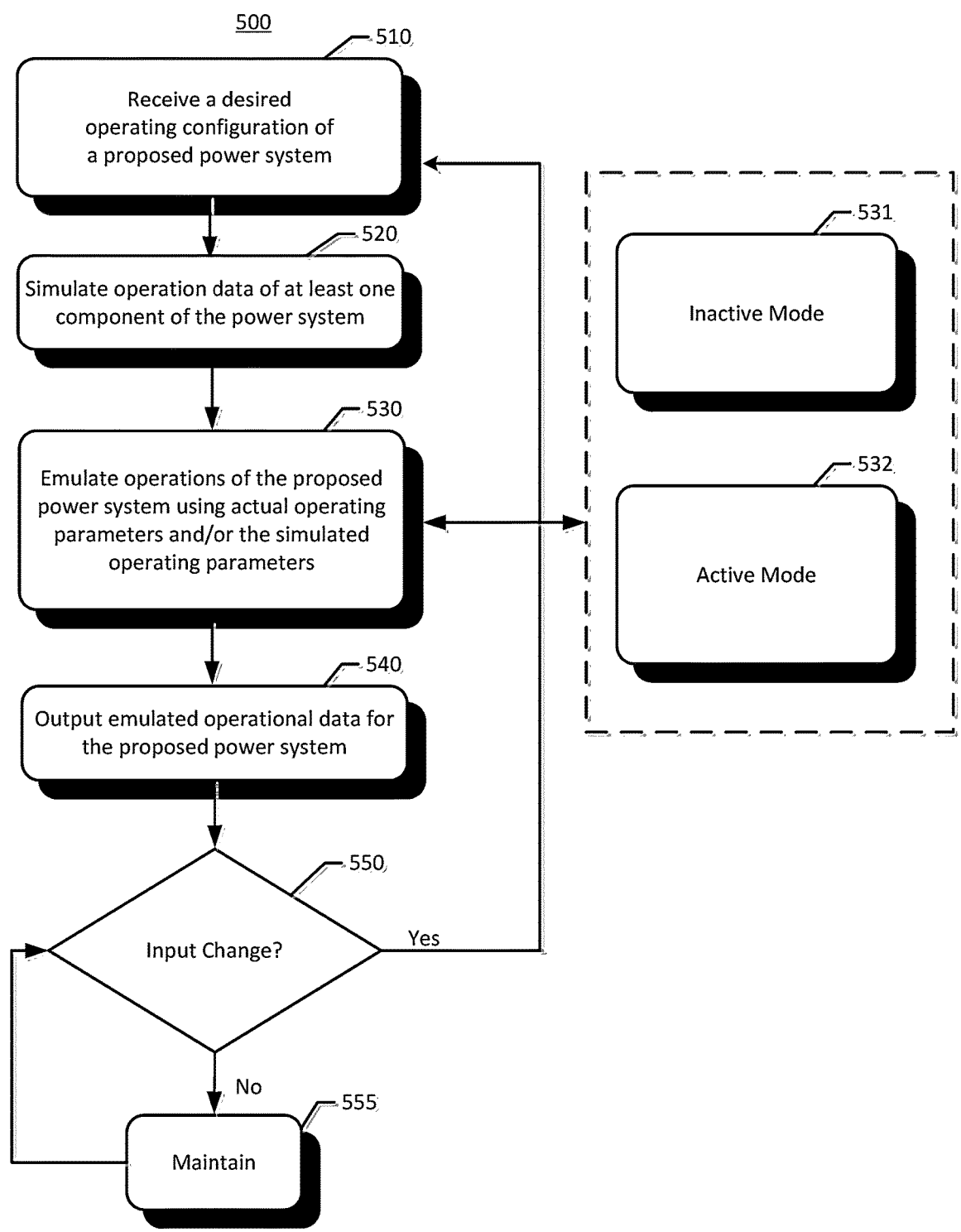

EMULATING POWER SYSTEM OPERATIONS

CROSS REFERENCE TO RELATED APPLICATION

This application is related to U.S. application Ser. No. 13/705,426 titled "MANAGING EFFICIENCY OF AN ENGINE-DRIVEN ELECTRIC GENERATOR" by Claes Høll Sterregaard, et al. and U.S. application Ser. No. 13/705,523 titled "MANAGING EFFICIENCY OF A POOL OF ENGINE-DRIVEN ELECTRIC GENERATORS" by Claes Høll Sterregaard, et al. filed on Dec. 5, 2012, the entire contents of which are hereby incorporated by reference as though fully set forth herein.

BACKGROUND

Electric power generators are operated as a backup electricity source for critical facilities such as hospitals in the event of an outage. Power generators are also operated in remote locations which cannot be readily connected to the power grid infrastructure (e.g., located "off-grid"). Power generators are also operated to support the grid during times of high demand, also known as "periods of constraint."

While alternative power sources are becoming more commonplace (e.g., solar panel and wind turbine installations), electric power generators that burn carbon-based fuels are still the predominant means of providing a reliable source of backup, grid-supplement and/or off-grid electricity. The term "carbon-based fuels" includes for example, but is not limited to, dry gas such as hydrogen, methane or butane; wet gas such as petrol/gasoline; and oil fuels such as diesel or heavy fuel oil.

Power systems that utilize these and other types of electric power generators, are typically custom configured for customers according to specific end-use applications. That is, nearly every power system is unique in function for each specific installation and thus cannot be implemented in an "out-of-the-box" manner. Due to the critical nature of a power system, customers often demand complete and thorough system testing during the installation process, in order to reduce or altogether eliminate operating failures and sequence of operation failures during service. This testing can take weeks or even months to complete. In addition, electrical and mechanical stresses due to an improperly configured system can result in equipment malfunction or even complete failure.

BRIEF DESCRIPTION OF THE DRAWINGS

FIG. 2 is a schematic diagram illustrating implementation of power system operations emulation.

FIG. 5 is a flowchart illustrating example operations which may be implemented to emulate power system operations.

DETAILED DESCRIPTION

Due to the critical nature of a power system, owners often demand complete testing of every possible configuration and failure mode in a new power system, and when adding new features to existing power systems before the power systems are released for operation. This system testing is time consuming, and can be costly if unforeseen electrical and mechanical stresses cause equipment malfunction or failure.

Switchgear (e.g., disconnect switches such as circuit breakers) may be used in testing to isolate and de-energize equipment in a power system. A substantial amount of expensive switchgear equipment is often needed for typical power system testing. Switchgear testing often calls for time-consuming cabling work when changing between different test environments. Even when not being used for testing, the switchgear equipment needs to be stored and maintained, increasing its cost. In addition, the variety of the possible power management applications supported by a dedicated purpose controller and the introduction of more sophisticated, higher level, plant management controls make it difficult to use conventional switchgear to perform sufficient testing prior to deployment.

The systems and methods disclosed herein provide a combined software and hardware emulation environment, enabling testing of most if not all of the features of a proposed power system configuration in a safe and reduced risk or even risk-free environment. Also, because these carbon-fuel based generation systems do not need to actually run during the emulation, this emulation process can also save fuel and reduce hydrocarbon emissions during testing.

Figure 1A:
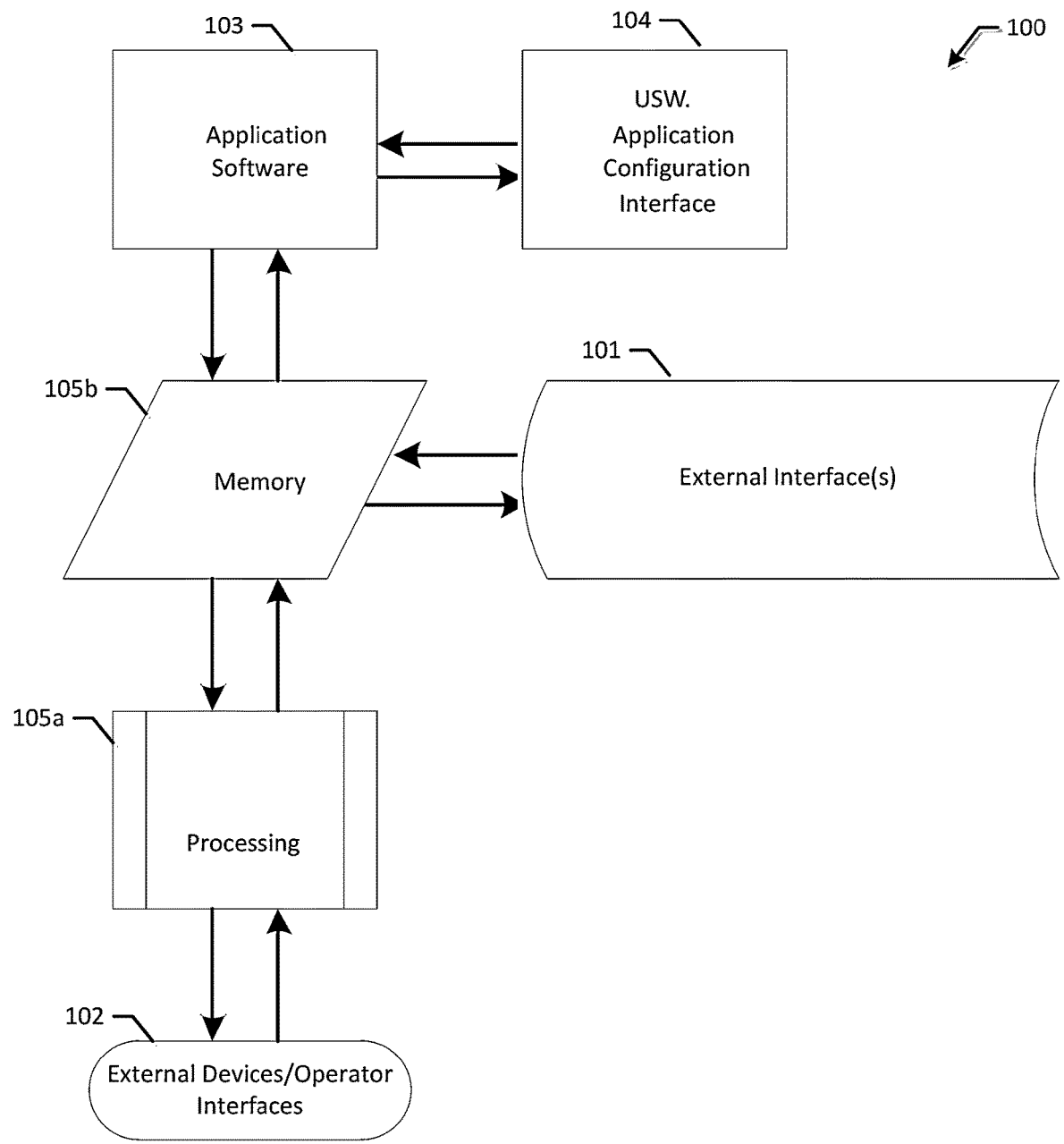
FIG. 1a is a process flow diagram of a controller for an engine-driven electric generator.

FIG. 1a is a process flow diagram of a controller 100 for an engine-driven electric generator. Electric power generators used in the power systems described herein may be controlled by dedicated electronic control computers (referred to generally as "controllers"). These controllers 100 have electronic circuits to convert various physical quantities of power (e.g., volts, amps, and watts) to digital values that can be used in processors internal to the controller. The processor reads external interfaces 101 (e.g., operator interfaces, process control and/or monitoring interfaces, data sharing interfaces, and/or other power system controllers). This actual or "real-world" operating data is obtained during actual operation of power system equipment 102. This data is then used by the processing environment (e.g., processor 105a and memory 105b) to perform operational sequences, protective functions, and related operational requirements while running in the "real-world" environment, which may be output by application software 103 via an application configuration interface 104.

In the Emulation environment, the controller 100 implements a subsystem (subroutine) that is a software model of a gen-set or other power system component(s) used to create simulated operational data based on a model of the power system, such as but not limited to voltage, current, fuel flow and power produced. This simulated data is then used in the Emulation of a new, proposed, or already existing power system to verify system operation. The normal processes of the power system controller can act on these simulated inputs and produce realistic outputs that allow the user to verify that functions of the simulated power system are working as intended—without having to actually operate the equipment according to the proposed power system configuration. In addition, adjustments to the proposed power system configuration can be made and tested in the Emulation environment to better achieve the customer's goals and address any concerns, prior to installing and bringing an actual power system into service.

Accordingly, the use of the systems and methods described herein reduce or altogether eliminate operating failures when the power system is actually brought into service, so that the power system can provide a reliable source of backup, grid-supplement and/or off-grid electricity while effectively reducing downtime due to a malfunction or system mis-operation and the associated liabilities and maintenance costs.

Before continuing, it is noted that as used herein, the terms "includes" and "including" mean, but is not limited to, "includes" or "including" and "includes at least" or "including at least." The term "based on" means "based on" and "based at least in part on."

The term "simulation" refers to the imitation of the operation of a real-world process or system over time. The act of simulating is based on a model that represents characteristics or behaviors of the selected system and/or process. The model represents the system itself, whereas the simulation represents operation of the system over time.

The term "gen-set simulation subroutine" refers to program code that receives system and operational information and produces artificial values or data that closely resemble real-world operational data.

The term "emulation" refers to the overall system that includes the gen-set simulation subroutine and simulation of other power system devices.

The term "fuel management" refers to monitoring the fuel consumed by one or more engine-driven electric generator(s), moving fuel from various tanks to ensure the engine-driven electric generator(s) always has/have fuel available, and reporting this information to various human interface devices for action as necessary.

Figure 1B:
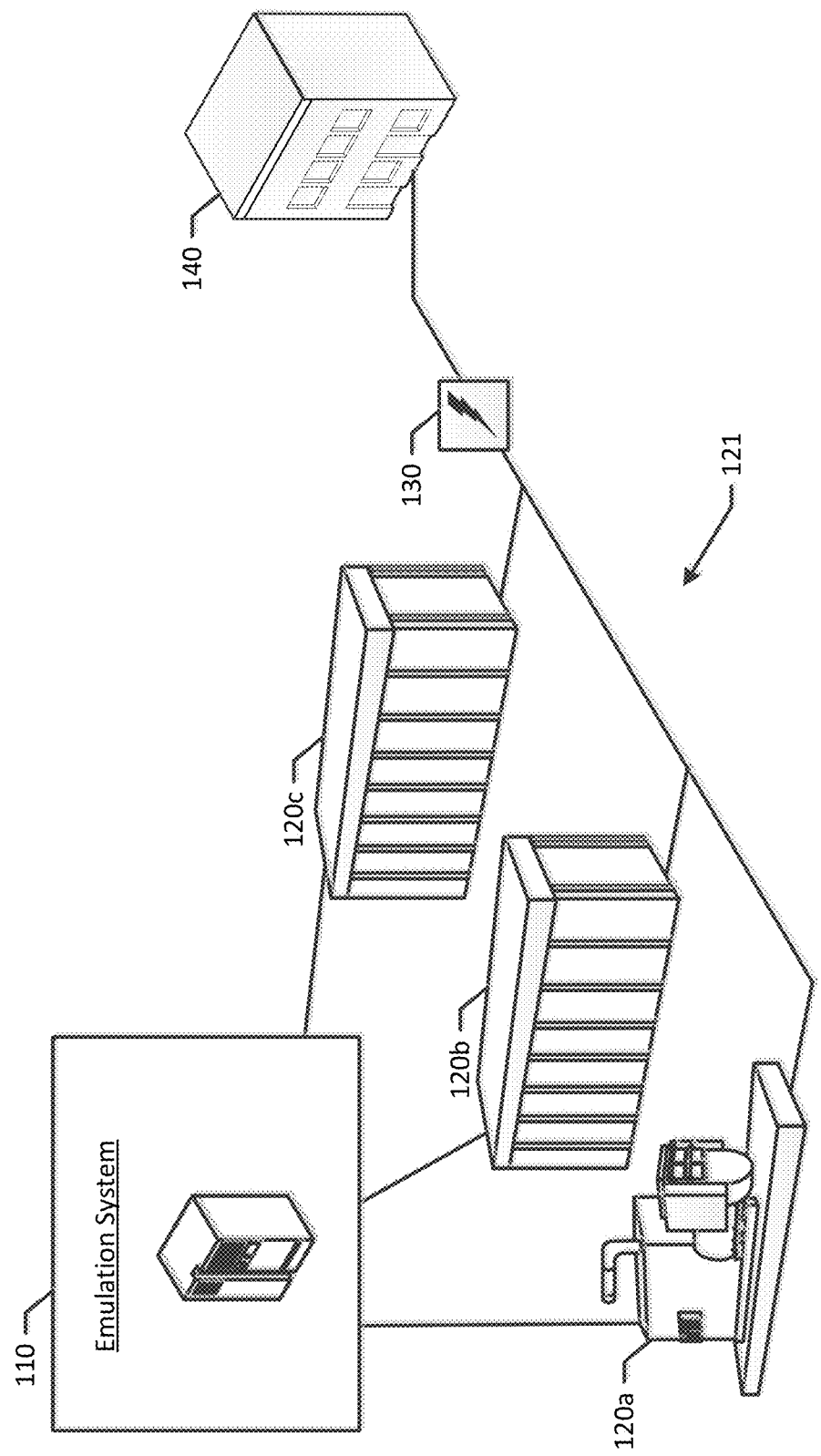
FIG. 1b is a high-level illustration of an example engine-driven electric generator environment which may be emulated.

FIG. 1b is a high-level illustration of an example engine-driven electric generator environment which may be emulated. In this illustration, the engine-driven electric generator environment may be a proposed configuration, e.g., to provide a backup electricity source for a critical facility such as a hospital in the event of an outage. Of course, other proposed configurations are also possible. Numerous other examples of such proposed power system environments also exist, and the systems and methods described herein may be utilized in any such environment.

In FIG. 1b, an electric power generator 120a is shown as equipment, and electric power generators 120b-c are shown as the equipment may be housed in a container (e.g., similar to shipping containers). Other examples may include housing the electric power generators in a trailer (e.g., for easy transport) or in a dedicated facility, such as an out-building or other structure.

In an example, the electric power generators are engine-driven electric generators (or "gen-sets"). Each gen-set is a combination of an engine (or prime mover) and an electrical generator, typically mounted together to form a single piece of equipment. Fuel storage, cooling and exhaust systems are provided for the engine. The gen-sets may also include control mechanisms (not shown in FIG. 1b) such as an engine governor, a voltage regulator, and a power conditioner, to name only a few examples.

The engine may be a reciprocating engine. A reciprocating engine uses one or more pistons to convert pressure into rotation, similar to an internal combustion engine in a car or other vehicle. Each piston may have a cylinder, in which the fuel is introduced. The fuel is heated by ignition of an air-fuel mixture (or by contact with a heat exchanger), such that the heated fuel expands and pushes the piston inside the cylinder. The piston returns to the initial position in the cylinder by power exerted from other pistons connected on the same shaft, or by the same process on the other side of the piston. Exhaust is removed from the cylinder and the process repeats, generating rotation of a drive shaft. The drive shaft may be used in turn to power the generator.

The generator converts mechanical energy from rotation of the drive shaft into electrical energy. An alternator uses a rotating field winding and a stationary winding (the "stator") that produces alternating current (AC). The alternator may be operated at a speed corresponding to a specified frequency to produce AC. It may be necessary to accelerate the alternator to the correct speed and phase alignment to produce proper AC output for the application.

Gen-sets are available having a wide range of power ratings, and the gen-set is typically sized and selected based on the load that is being powered. Reciprocating engines may be configured to operate at various output levels depending on application, load at any given time, and other operating data.

It is noted that the specific configuration shown in FIG. 1b is for purposes of illustration only, and is not intended to be limiting in any way.

As discussed above, the Emulation environment uses simulated operational data which were obtained from a separate subroutine within the controller that models a gen-set described above. The Emulation environment further simulates operational data according to the proposed configuration, thus allowing the power system to be verified, modified, and confirmed operational before actually bringing the power system into service. This gen-set simulation subroutine acts upon stimuli from the normal operational processes of the controller.

By way of illustration, during normal operation the controller may calculate a torque reference signal that is sent to the governor on the engine to increase or decrease fuel to obtain the required torque. In Emulation mode, the normal controller output is read by the gen-set simulator subroutine in the controller. The gen-set simulator subroutine then acts upon this torque reference to increase or decrease the simulated values of speed or power as appropriate. In this fashion, the generator simulation subroutine closes the loop to create a closed loop regulated Emulation, thus accurately simulating the operation of the gen-set. This simulated gen-set operational data is then written to the memory and appears to the normal operation sequences as a "real" generator. Control, protection, and other normal operational sequences then "react" to this simulated data as if the data was from an operating gen-set. In addition, this simulated gen-set data may be shared with other components of the power system to verify correct operation of other subsystems that use this data.

The systems and methods described herein may be implemented to emulate operation of the gen-set(s) 120a-c and/or other power system component(s) of a proposed power system. The systems and methods described herein may also be used to emulate operation of control systems, protection systems (e.g., circuit breakers and protective relaying functions in the controller), and overall power plant operation to name only a few examples. Other use cases also exist. Although any user (e.g., plant operators, engineers, etc.) can benefit from use of the systems and methods described herein, for purposes of illustration, the user may be a design engineer working with a customer during a design phase during or prior to installation.

FIG. 2 is a schematic diagram 200 illustrating implementation of an example Emulation system 110. A controller 210 may be utilized which includes sufficient processing capability to execute program code 220 stored on a computer readable media 230. In an example, each power system component (e.g., each gen-set) includes its own controller

210. Accordingly, the emulation system 110 may be referred to as a "subsystem" when applied to an individual power system component (e.g., an individual gen-set), and each subsystem interconnected (e.g., as illustrated in FIG. 3*c* described below) or connected to a master controller for the power system, comprises the overall emulation system 110 for a power system.

The program code 220 includes the gen-set simulation subroutine and other Emulation software, and resides and runs on actual, physical controller(s) 210 (e.g., controllers already provided for one or more power system components).

The program code 220 may be implemented as machine readable instructions (such as but not limited to, software and/or firmware), which may be executed by the controller 210 for performing functions of the Emulation system 110. The machine-readable instructions may be stored on a non-transient computer readable medium and are executable by one or more processor to perform the operations described herein. It should be understood that various functions may also be implemented in control circuitry, such as but not limited to, logic circuits. For example, the Emulation system 110 may operate on and/or with a variety of digital electronic controls including but not limited to PLC's and dedicated purpose digital controllers, any of which may operate using the algorithms described herein.

It is noted that the Emulation system 110 is not limited in function, and the Emulation system 110 may also provide other services. For example, the operator devices illustrated in FIG. 2*a-b* may issue reports to the operator's laptop computer 251, tablet device 252, mobile device 253, or other general-purpose computing device. In addition, there is no limit to the type or amount of data that may be utilized (i.e., received, processed, and/or output) by the Emulation system 110. In addition, the data may include unprocessed or "raw" data from control circuitry at the gen-sets 120*a-c*, or the data may undergo at least some level of pre-processing.

The Emulation system 110 may be implemented to test various configurations of power systems in an Emulation environment 270 (e.g., including one or more engine-driven electric generators 271*a-b*). In an example, the Emulation system 110 may be utilized at a customer site or design center with actual gen-sets, or entirely off-site (e.g., apart from the power system at trade show exhibitions or presentations).

The Emulation system 110 may interface with user 250 to generate and report results from the Emulation environment 270. For example, the Emulation system 110 may receive input from the user 250, as illustrated by input line 260. Input from the user 250 may include a desired configuration of the power system (e.g., the number and/or size of individual gen-sets 271*a-b* to use). The desired configuration of the power system may be constant and/or change during use (e.g., to test different configurations). The Emulation system 110 may also provide output to the user 250. Example output to the user 250 may include simulated operating conditions of the gen-sets, and/or other subsystems and/or components of the proposed power system configuration, (e.g., including but not limited to warnings and alerts)

During operation, the Emulation system 110 retrieves simulation data from the gen-set simulation subroutine running on the controller(s). The Emulation system 110 uses this data to emulate operations of the proposed power system. More than one desired configuration can be tested without having to build and operate the proposed power system. Various events (e.g., failures) can also be tested without endangering people or equipment. Once a desired configuration has been tested to satisfaction, the actual power system can be built with relative confidence in the expected operations.

Before continuing, it is noted that the components shown in FIG. 2 are provided only for purposes of illustration of an example operating environment, and are not intended to limit implementation to any particular system. The functions described herein are not limited to any specific implementation with any particular type of program code and control circuitry.

Figure 3A:
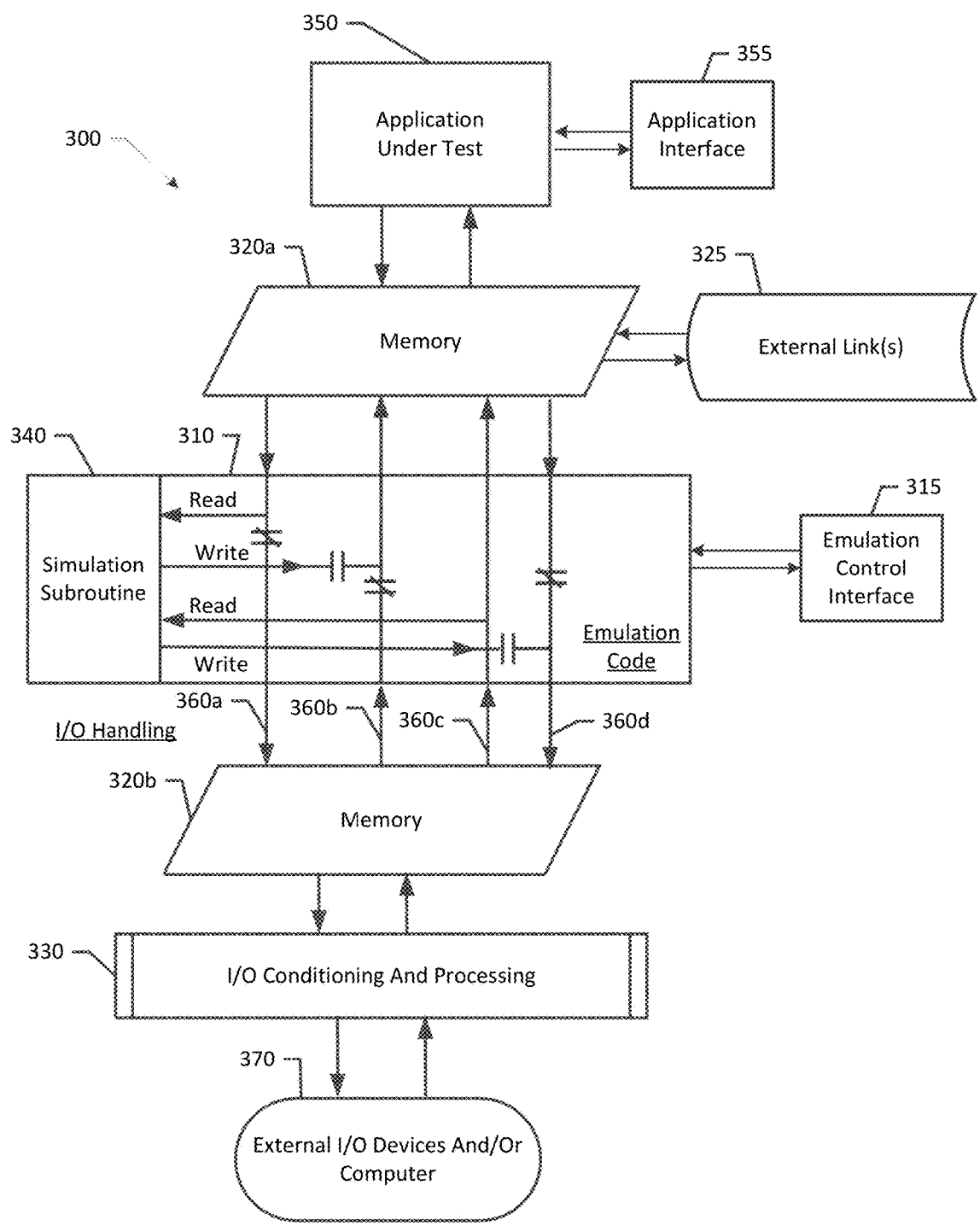
FIGS. 3a-c illustrate an example architecture to emulate power system operations.
Figure 3B:
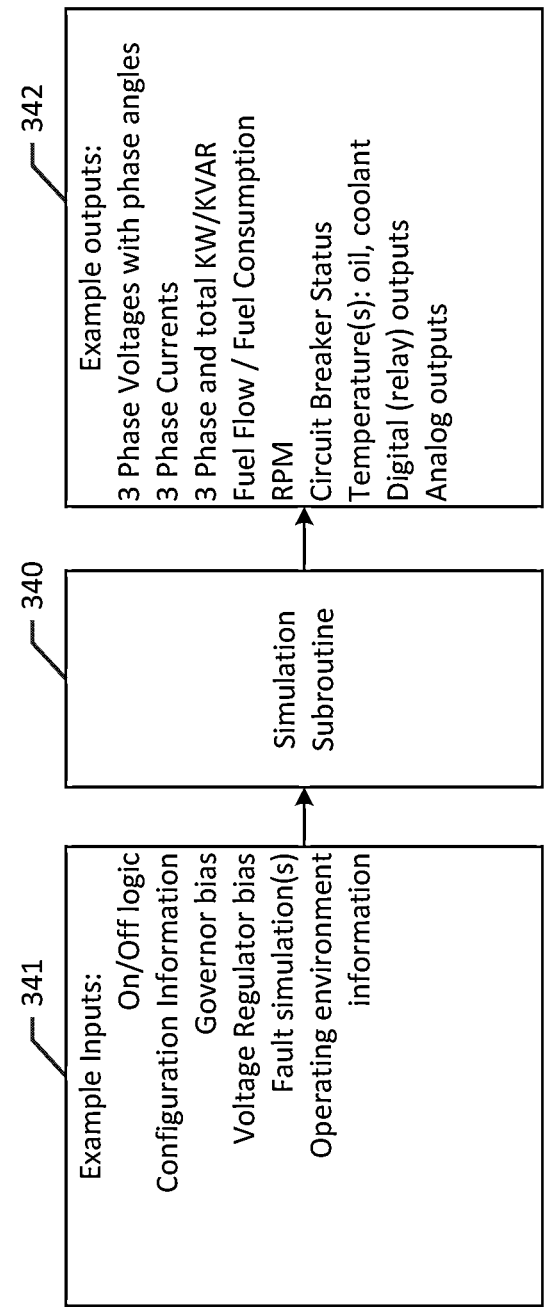
Figure 3C:
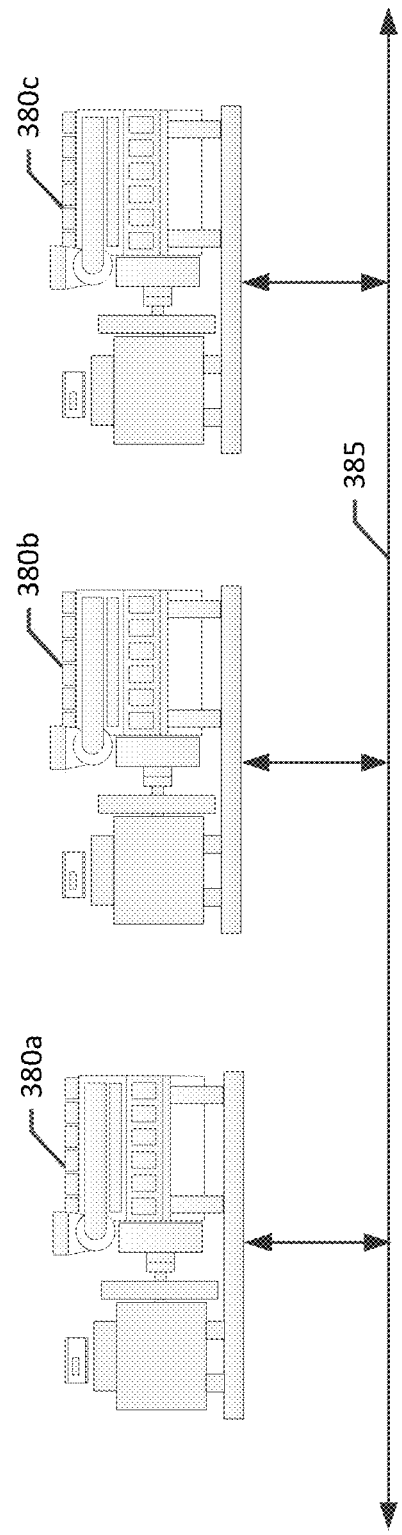

FIGS. 3*a-c* illustrate an example architecture to emulate power system operations. FIG. 3*a* is a process flow diagram 300, wherein the Emulation system 110 may include a processor 310 configured to populate a data structure in memory with output data calculated by a gen-set simulation subroutine running on the controller. Although more than one memory 320*a-b* is shown in FIG. 3*a*, it is noted that the organizational structure is not limited to this configuration. Indeed, a single memory may be provided having separate data stores or partitions. The processor 310 reads and writes data to the memory 320*a-b*.

An I/O conditioning and processing module 330 may be used to bring actual or "real-world" operating data into the memory 320*a-b*, and write processor outputs to various I/O devices (e.g., digital and/or analog outputs) in the power system. Emulation code 340 is executable by the processor 310 to generate simulated operational data based on user inputs and/or the actual operating data, and to output data corresponding to the emulation environment.

Emulation code 340 may be implemented as separate subroutines and embedded source code that run on processor 310 to populate memory 320*a-b* with actual operational data and/or, in Emulation mode, simulated gen-set data and/or emulated process data. FIG. 3*b* illustrates data which may be populated into the memory 320*a-b* by either the I/O Conditioning and Processing Module or by the simulation subroutine. Example data includes, but is not limited to: 3-phase voltages, 3-phase currents, 3-phase frequencies, 3-phases of power (e.g., measured in Watts or kilowatts) produced by the generators and consumed by loads, 3-phases of reactive power (volt-ampere reactive or vars) produced by the generators and consumed by loads, regulator output percentage, power factor, and angle between the current and voltage (CosPhi). Internal combustion engine data for the gen-sets may also be populated in memory 320*a-b*. Internal combustion engine Emulation may include, but is not limited to: RPM, coolant temperature, oil pressure, fuel consumption, fuel flow rate(s), and fuel level in tank(s) for fuel management.

With reference again to FIG. 3*a*, when the Emulation is active, the operational data is populated into the memory 320*a-b* by the gen-set simulation subroutine, for later use by the processor 310 to simulate operations for proposed power system configuration(s). That is, the Emulation code 340 uses the gen-set simulation subroutine data to create an Emulation environment, simulating operations of the power system without actually having to operate the power system components. The Emulation data may be visible to the user in application under test 350 and various operator interface devices 355, 325, and 315. Simulating real values in this manner enables the power system controls to be verified, modified, and confirmed operational before actually running real gen-sets and other circuitry (e.g., circuit breakers).

In an example, the Emulation system may be configured to provide audible feedback for the user (e.g., the sound of relays energizing in the power system) to add interest to the Emulation.

It is noted that the Emulation code 340 acts upon the gen-set simulation subroutine data in combination with processor outputs to create output simulating an actual operation of the power system, thereby completing a closed loop feedback of the power system. The data may be used to simulate operational data corresponding to desired configurations of a proposed power system.

Input/output (I/O) operations may be handled according to one of at least three separate techniques (illustrated in FIG. 3 by arrows 360a-c). The I/O handling technique that is implemented may depend at least to some extent upon the signal type and signal direction (e.g., into the processor 310 or output from the controller).

In a first example I/O handling technique 360a, the Application under test 350 writes an output to the memory 320b. Emulation includes reading output from the memory 320a and may allow, depending upon the configuration, the output to be passed on to the external I/O devices (e.g., power system components) and/or operator interface devices (e.g., a computer system (collectively referenced by 370) via the I/O Conditioning and Processing Module 330, or may only use this value in the Emulation or gen-set simulation subroutine. (e.g., depending upon an operator input).

In a second example I/O handling technique 360b, I/O Conditioning Module 330 makes real-world data available to the Emulation and/or gen-set simulation subroutine and may or may not write this data to the memory 320a. Based upon the Emulation step parameters, the Emulation allows the processor to use real data or calculate a simulated value and make the simulated value available to the Emulation code 310.

In a third example I/O handling technique 360c, module 330 writes data to the memory 320a. The Emulation reads this value to be used in Emulation calculations, but allows the Emulation code 310 to use real data from external I/O devices and/or operator interface devices 370.

In a fourth example I/O handling technique 360d, module 330 writes data to the memory 320b. The Emulation issues the value from Emulation calculations to external I/O devices and/or operator interface devices 370.

It is noted that simulated data for a new feature may be used in conjunction with actual data of an actual operating power system, without impacting actual operations of the power system, thereby enabling testing of the new feature in isolation, but under actual conditions of the already existing power system.

The Emulation environment may support an active mode and/or an inactive mode. For example, if the controller is connected to an existing power system, the active mode enables the controller to issue commands to the power system components (e.g., to the gen-sets, breakers and/or other equipment). If the user does not want the Emulation to affect actual power system components, then the inactive mode may be used to disable the power system controller from issuing actual commands (e.g., to the breaker and engine). That is, any changes the user makes at the controller do not operate the gen-sets (or other components of the power system).

As a further precaution, the module 330 may monitor AC voltage measurements in the power system, and if a voltage is detected, then the controller sends signals to the I/O conditioning and processing module 330 to shut down the Emulation, trip open the circuit breaker(s), and sets the system to a safe mode.

FIG. 3c shows an example of interconnecting the emulation subsystems across multiple power system components. As such, data from one or more of the Emulation systems may also be available for sharing on data communication links to other devices (including other Emulation systems or subsystems in the overall power system) that communicate and/or work in combination with the Emulation system.

For example, the emulation subsystem 380a may be interconnected to the emulation subsystem 380b may be interconnected to the emulation subsystem 380c, and so forth via bus 385. Each emulation subsystem 380a-c may be resident in a separate power system component (e.g., separate gen-sets). In addition to emulating the controller for power generating components (e.g., the gen-sets), the Emulation system may also simulate circuit breaker(s), safety subsystems, and/or alarm subsystems. For example, the Emulation environment may include simulated operations of tie breaker (circuit breakers that connect two electrical systems together) and "mains" or utility tie circuit breakers (circuit breakers that connect power generation systems into the "main" power grid).

The Emulation environment described in FIGS. 3a-c provides the user with the "look and feel" of an actual operating power system (e.g., not simply a computer simulation). The application under test interfaces also provide realistic data, allowing other devices (e.g., operator interfaces or building management process control computers) to monitor and/or provide inputs to be verified during Emulation.

Figure 4:
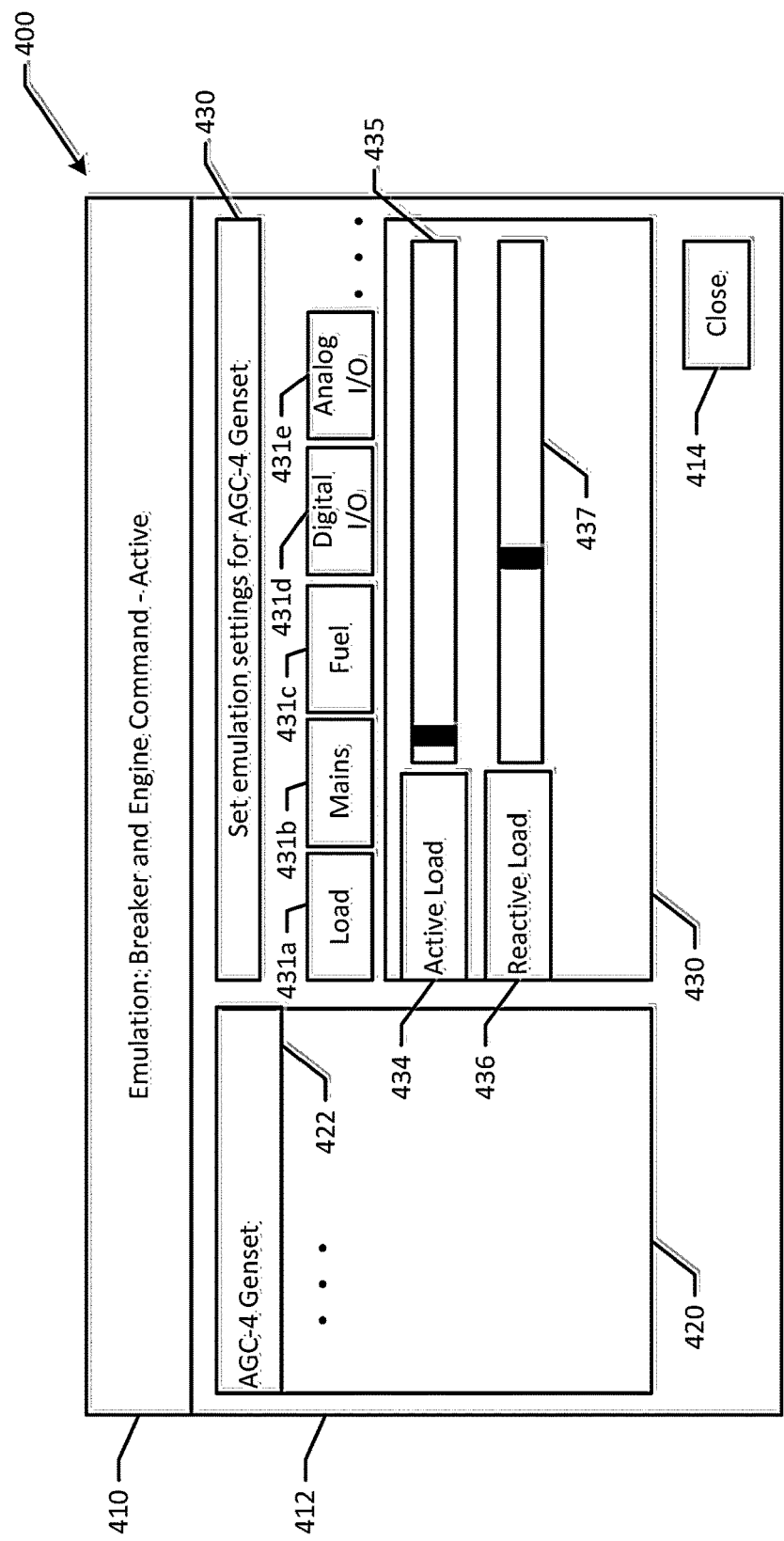
FIG. 4 shows an example interface for emulating power system operations.

FIG. 4 shows an example interface 400 for emulating power system operations. The example interface 400 may be implemented as a graphical user interface (GUI) in software, although other implementations are also possible (e.g., dedicated displays). The software environment executing the interface 400 is referred to as Utility Software or USW. The interface 400 is an Application Configuration Tool within the USW, wherein various Emulation controls are embedded.

During Emulation, the user may view and/or access various interface points to test and/or verify any operating condition in the power system. In an example, analog interface points may include: load references, temperatures, pressures, levels, operator inputs, etc. In another example, digital interface points may include: breaker positions, motor status, temperatures, pressures, levels, operator inputs, etc.

In FIG. 4, the interface 400 may include a title bar 410, an operations window 412, and a close button 314. The operations window 412 may display a selection window 420. In the example shown, one of the gen-sets is shown selected as indicated by reference 422. Settings corresponding to the selection 422 are displayed to the right, including the settings bar 330, and variables which may be adjusted. The Emulation may be used for, but is not limited to, the control of total power emulated, voltage generated, engine operating data, and all other Emulation inputs. In the example shown, settings for load 431a, mains 431b, fuel 431c, digital I/O 431d, and analog I/O 431e are displayed, and load 431 is selected. By way of illustration, in response to selecting load 431a, load controls for active load 434 and reactive load 436 are displayed, along with corresponding sliders 435 and 437 to control the active and reactive load in the emulation environment. By way of further illustration, digital I/O 431d and analog I/O 431e may be selected to display controls for these functions (e.g., turning on/off actual operating data used in the emulation environment).

It is noted that example interface 400 shown in FIG. 4 is provided only for purposes of illustration, and is not intended to be limiting. In addition, an implementation of the Emulation system described herein may include many different interface windows, the type and number depending on the types of Emulation parameters which are input/output for an Emulation environment. Each of these types of windows are not shown, as these may be readily implemented in interface code by those having ordinary skill in the art of interface programming, after becoming familiar with the teachings herein.

FIG. 5 is a flowchart illustrating example operations 500 which may be implemented to emulate power system operations (e.g., for engine-driven electric generators). At least some of the operations 500 may be embodied as logic instructions on one or more computer-readable medium. When executed on a processor, the logic instructions cause a controller to be programmed as a special-purpose machine that implements the described operations. In an example, the components and connections depicted in the figures may be used.

An example method of emulating power system operations includes at operation 510, receiving a desired operating configuration of a proposed power system. The operating configuration may include a number of engine-driven electric generators, safety requirements (e.g., breakers), power output (e.g., peak output in addition to variable output such as during different times), power conditioning requirements, environmental parameters (e.g., climate, altitude), and desired operating efficiency, to name only a few examples.

The method may include at operation 520 simulating operating data of at least one component (e.g., a gen-set and/or breaker) of the power system. The method may also include at operation 530 emulating operations of the proposed power system using actual operating data and/or the simulated operating data.

It is noted that the Emulation environment may include an inactive mode and/or an active mode. In an inactive mode 531, the Emulation does not impact operation of the power system. That is, the Emulation does not issue commands to the physical components of the power system. All input/output during the Emulation is simulated.

In an active mode 532, the Emulation may issue commands to the physical components of the power system and/or receive actual input from one or more physical component of the power system (e.g., fuel tank level). It is noted that in the active Emulation mode, unforeseen and potentially unsafe conditions may present. Accordingly, a safe mode may be entered when an unsafe condition in the power system is detected. The safe mode may include shutting down operations.

The method may also include at operation 540 outputting emulated operational data for the proposed power system into an actual control and monitoring system to emulate operations of the proposed power system. As such, the method may be used for testing and verifying operation of the desired operating configuration before putting the power system into service. Still other uses are also contemplated, for example, simulating a failure state to verify operation of safety and alarm subsystems in the proposed power system.

The method may also include a reciprocating loop, in which any input is monitored in operation 550. For example, a change of input may include operator input, such as a new desired electrical power output parameter. If a change is detected, the technique may return to operation 510. If no change is detected, then the system maintains current operations at 555, and continues monitoring as indicated by the loop from operation 555 to decision operation 550.

The operations shown and described herein are provided to illustrate example implementations. It is noted that the operations are not limited to the ordering shown. Still other operations may also be implemented.

The operations may be implemented at least in part using an end-user interface (including but not limited to analog, digital, computer, and web-based interfaces). In an example, the operator is able to make predetermined selections, and the operations described above are implemented to emulate engine-driven electric generator(s), including associated protection systems and overall power plant operation. The operator can then make further selections which result in the execution of further operations. It is also noted that various of the operations described herein may be automated or partially automated.

It is noted that the examples shown and described are provided for purposes of illustration and are not intended to be limiting. Still other examples are also contemplated.

The invention claimed is:

1. A system, comprising:
 a physical dedicated electronic control computer arranged to control a single engine-driven electric generator, said computer including:
  a gen-set simulator subroutine to emulate operation of the engine-driven electric generator;
  a memory to store simulated operating data of the engine-driven electric generator from the gen-set simulator subroutine;
  an interface with embedded controls; and
  a controller that calculates a torque reference signal,
  the computer having a mode selectable among one of a plurality of modes, the plurality of modes including a normal operation mode and an emulation mode, the computer operating non-simultaneously in one of the normal operation mode and of the emulation mode,
  where, during the normal operation mode, the torque reference signal is sent to a governor on an engine of the engine-driven electric generator to increase or decrease fuel to obtain the required torque, for controlling an operation of the engine,
  the interface outputting real operational data of the engine-driven electric generator into an actual control and monitoring system in response to inputs, and
  where in the normal operation mode, the controller receives as an input an actual operating state of the engine to calculate the torque reference signal,
  where when in the emulation mode, the controller output is read by the gen-set simulator subroutine which then acts upon this torque reference to increase or decrease the simulated values of speed or power,
  the interface outputting emulated operational data into the actual control and monitoring system to emulate operations of the engine-driven electric generator in response to inputs,
  where, in the emulation mode, the controller receives as the input the output from the gen-set simulator subroutine, and
  where the system is emulated to be operated in a proposed or desired configuration in the emulation mode, and where the system is operated in the proposed or desired configuration in the normal operation mode.

2. The system of claim 1, wherein the emulated operational data for the engine driven electric generator includes simulated physical measurement data.

3. The system of claim 1, wherein the inputs include analog simulations of load reference, reactive power reference, temperature, pressure, fuel flow, and operator inputs, and digital simulations of breaker position, motor status, temperature, pressure, and operator inputs.

4. The system of claim 1, wherein the inputs include a simulated failure of at least one component of the system.

5. The system of claim 1, wherein the simulated operating data includes data for ancillary power system devices including at least subsystems for heat exchangers, fuel management, process controllers, and balance-of-plant controllers to test and verify operation of the subsystems.

6. The system of claim 1, wherein a desired operating configuration of the system comprises circuit breakers connecting a plurality of electrical circuits together.

7. The system of claim 6, wherein the electrical circuits comprise a power generation station and an electrical power grid.

8. The system of claim 1, wherein the controller operates in evaluation modes for "what if" testing, development testing, proof-of-concept testing, and failure mode testing.

9. The system of claim 1, further comprising a second physical dedicated electronic control computer, said second physical dedicated control computer being arranged to control an additional engine-driven electric generator.

* * * * *